(12) United States Patent
Nakahara et al.

(10) Patent No.: US 6,647,522 B1
(45) Date of Patent: Nov. 11, 2003

(54) SEMICONDUCTOR DEVICES HAVING MULTIPLE MEMORIES

(75) Inventors: Hideaki Nakahara, Kawasaki (JP);
Masahiko Sudo, Kasugai (JP);
Yasuhiro Kawakami, Kasugai (JP);
Terumi Yoshimura, Kasugai (JP);
Kiminori Kato, Kasugai (JP); Tetsuya Hiramatsu, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 299 days.

(21) Appl. No.: 09/584,778

(22) Filed: Jun. 1, 2000

(30) Foreign Application Priority Data

Aug. 25, 1999 (JP) ............................. 11-238714

(51) Int. Cl.$^7$ .......................... G11C 29/00; G01R 31/28
(52) U.S. Cl. ...................... 714/720; 714/728; 714/729; 714/730
(58) Field of Search ................................ 714/718–723, 714/726–731

(56) References Cited

U.S. PATENT DOCUMENTS

| | | | | |
|---|---|---|---|---|
| 5,271,019 A | * | 12/1993 | Edwards et al. ............ 714/730 |
| 5,388,104 A | * | 2/1995 | Shirotori et al. ............ 714/718 |
| 5,579,322 A | * | 11/1996 | Onodera ..................... 714/730 |
| 5,675,545 A | * | 10/1997 | Madhavan et al. ......... 365/201 |
| 5,734,615 A | * | 3/1998 | Dierke ....................... 365/201 |
| 5,812,472 A | * | 9/1998 | Lawrence et al. .......... 365/201 |
| 5,946,247 A | * | 8/1999 | Osawa et al. ............... 365/201 |
| 5,995,731 A | * | 11/1999 | Crouch et al. ................. 716/4 |
| 6,044,481 A | * | 3/2000 | Kornachuk et al. ......... 714/724 |
| 6,341,092 B1 | * | 1/2002 | Agrawal ..................... 365/201 |
| 6,360,342 B1 | * | 3/2002 | Lee et al. ................... 714/718 |
| 6,363,020 B1 | * | 3/2002 | Shubat et al. ............... 365/200 |

* cited by examiner

Primary Examiner—Albert Decady
Assistant Examiner—Joseph D. Torres
(74) Attorney, Agent, or Firm—Staas & Halsey LLP

(57) ABSTRACT

A semiconductor device having multiple memory circuits of varying sizes includes scan test circuitry that enables the memories to be simultaneous loaded with pattern data and tested. A first memory circuit has a first memory, a first address scan chain that receives serial scan-in address data and generates a first address signal, and a first data scan chain that receives serial scan-in data and generates a first data input signal. A second memory circuit has a second memory, a second address scan chain that receives the serial scan-in address data and generates a second address signal, and a second data scan chain that receives the serial scan-in data and generates a second data input signal.

9 Claims, 11 Drawing Sheets

Fig.5(a)

|  | COL 0 | COL 1 |
|---|---|---|
| ROW 00 | 11 | 00 |
| ROW 01 | 00 | 11 |
| ROW 10 | 11 | 00 |
| ROW 11 | 00 | 11 |

Fig.5(b)

|  | COL 00 | COL 01 | COL 10 | COL 11 |
|---|---|---|---|---|
| ROW 00 | 1 | 0 | 1 | 0 |
| ROW 01 | 0 | 1 | 0 | 1 |
| ROW 10 | 1 | 0 | 1 | 0 |
| ROW 11 | 0 | 1 | 0 | 1 |

Fig.6

| Address (IA_SI) | Data Input (ID_SI) | RAM_X Data Input | RAM_Y Data Input |
|---|---|---|---|
| 0000 | 11 | 11 | 1 |
| 0001 | 00 | 00 | 0 |
| 0010 | 11 | 00-Inverted | 1 |
| 0011 | 00 | 11-Inverted | 0 |
| 0100 | 11 | 11 | 0-Inverted |
| 0101 | 00 | 00 | 1-Inverted |
| 0110 | 11 | 00-Inverted | 0-Inverted |
| 0111 | 00 | 11-Inverted | 1-Inverted |
| 1000 | 11 | – | 1 |
| 1001 | 00 | – | 0 |
| 1010 | 11 | – | 1 |
| 1011 | 00 | – | 0 |
| 1100 | 11 | – | 0-Inverted |
| 1101 | 00 | – | 1-Inverted |
| 1110 | 11 | – | 0-Inverted |
| 1111 | 00 | – | 1-Inverted | though
SEMICONDUCTOR DEVICES HAVING MULTIPLE MEMORIES

BACKGROUND OF THE INVENTION

The present invention relates to a semiconductor device, and more particularly, to a method for testing a semiconductor device that includes a plurality of memory circuits having different configurations.

Both logic circuits and mass storage memory circuits can be arranged on the same semiconductor device (LSI). Further, to perform multiple functions, the memory circuits on the LSI chip can have differing capacities and bus widths.

The logic circuits and memory circuits are tested with a tester before the LSI is shipped out of the factory. If a DRAM is arranged on the LSI chip, there may be a plurality of deficient modes due to the DRAM configuration. To eliminate such deficient modes, tests must be performed on the memory circuits under various conditions using a large number of data patterns. Thus, if the number of memory circuits on the LSI increases, the testing time becomes longer and the cost of the LSI chip increases.

FIG. 1 is a schematic block circuit diagram showing a prior art semiconductor device 11 provided with memory circuits 12, 13. The memory circuits 12, 13 have different configurations and are designed in accordance with a RAM-SCAN mode.

The memory circuit 12 includes a memory section 14 and a scan chain 15. The scan chain 15 incorporates scan type flip flops (hereafter referred to as SFF) 16, the number of which corresponds to the number of input/output bits of the memory section 14. The SFFs 16 are connected in a daisy chain. The scan chain 15 receives a test signal TI via a scan data input terminal SDI in synchronism with a scan clock (not shown) of the SFFs 16. Then, the scan chain 15 functions as a shift register and outputs a shifted test signal from a scan data output terminal SDO. The scan data output terminal SDO is connected to another scan chain 17 located outside the memory circuit 12. The scan chain 17 has SFFs 16 connected in series with the SFFs 16 of the scan chain 15.

The memory circuit 13 includes a memory section 18 and a scan chain 19. The scan chain 19 incorporates SFFs 16, the number of which corresponds with the number of input/output bits of the memory section 18. Each of the SFFs 16 are connected in a daisy chain. The scan chain 19 functions as a shift register in accordance with a scan clock (not shown). An output terminal of the memory circuit 13 is connected to another scan chain 20, which includes SFFs 16 connected in series with the SFFs 16 of the scan chain 19.

When a test mode is entered, a tester (not shown) connected to an external terminal 21 provides a serial test signal TI to the memory circuits 12, 13. The scan chains 15, 19 shift the test signal TI and provide the shifted test signal TI to the respective memory sections 14, 18 as addresses and input data. The scan chains 17, 20 provide the output data from the associated memory circuits 12, 13 to a selection circuit 22 as serial test output data.

The selection circuit 22 selects the test output data of the memory circuit 12 or the test output data of the memory circuit 13 in accordance with a memory select signal MS0 provided from the tester via an external terminal 23. Then, the selection circuit 22 provides the selected test output data to the tester via an external terminal 24. The tester determines whether or not the memory circuit 12, 13 is defective based on the test output data.

However, since the test pattern data of the memory circuits 12, 13 differs in accordance with their size and data lengths, the tester must test the memory circuits 12, 13 separately. For example, if the memory circuits 12, 13 are both tested using the test pattern data of the memory circuit 12, pattern data differing from the desired pattern is stored in the memory section 18 of the memory circuit 13. Hence, the test result related to the memory circuit 13, which is based on the output data from the memory section 18, is erroneous.

Further, since the test pattern data, which is complicated and used to identify a large number of deficient modes, differs between each memory circuit in accordance with the memory circuit's capacity, the amount of the test pattern data is relatively large. Accordingly, the generation of test patterns for all of the memory circuits takes a long time. This increases the total time required for memory circuit testing (preparation time and actual testing time) and, consequently, the cost of the LSI chip.

SUMMARY OF THE INVENTION

It is an object of the present invention to provide a semiconductor device that requires less time to test a plurality of memory circuits.

To achieve the above object, the present invention provides a semiconductor device having a plurality of memory circuits including a first memory circuit and a second memory circuit. The first memory circuit includes a first memory having a first address width and a first data width, a first address scan chain connected to the first memory to receive serial scan-in addresses and generate a first address signal corresponding to the first address width, and a first data scan chain connected to the first memory to receive serial scan-in data and generate a first data input signal corresponding to the first data width. The second memory circuit includes a second memory having a second address width differing from the first address width and a second data width differing from the first data width, a second address scan chain connected to the second memory to receive the serial scan-in addresses and generate a second address signal corresponding to the second address width, and a second data scan chain connected to the second memory to receive the serial scan-in data and generate a second data input signal corresponding to the second data width.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 5(a) and 5(b) are charts showing checker patterns;

FIG. 6 is a chart showing various data used during checker pattern testing;

DETAILED DESCRIPTION OF THE PREFERRED EMBODIMENTS

Figure 1:
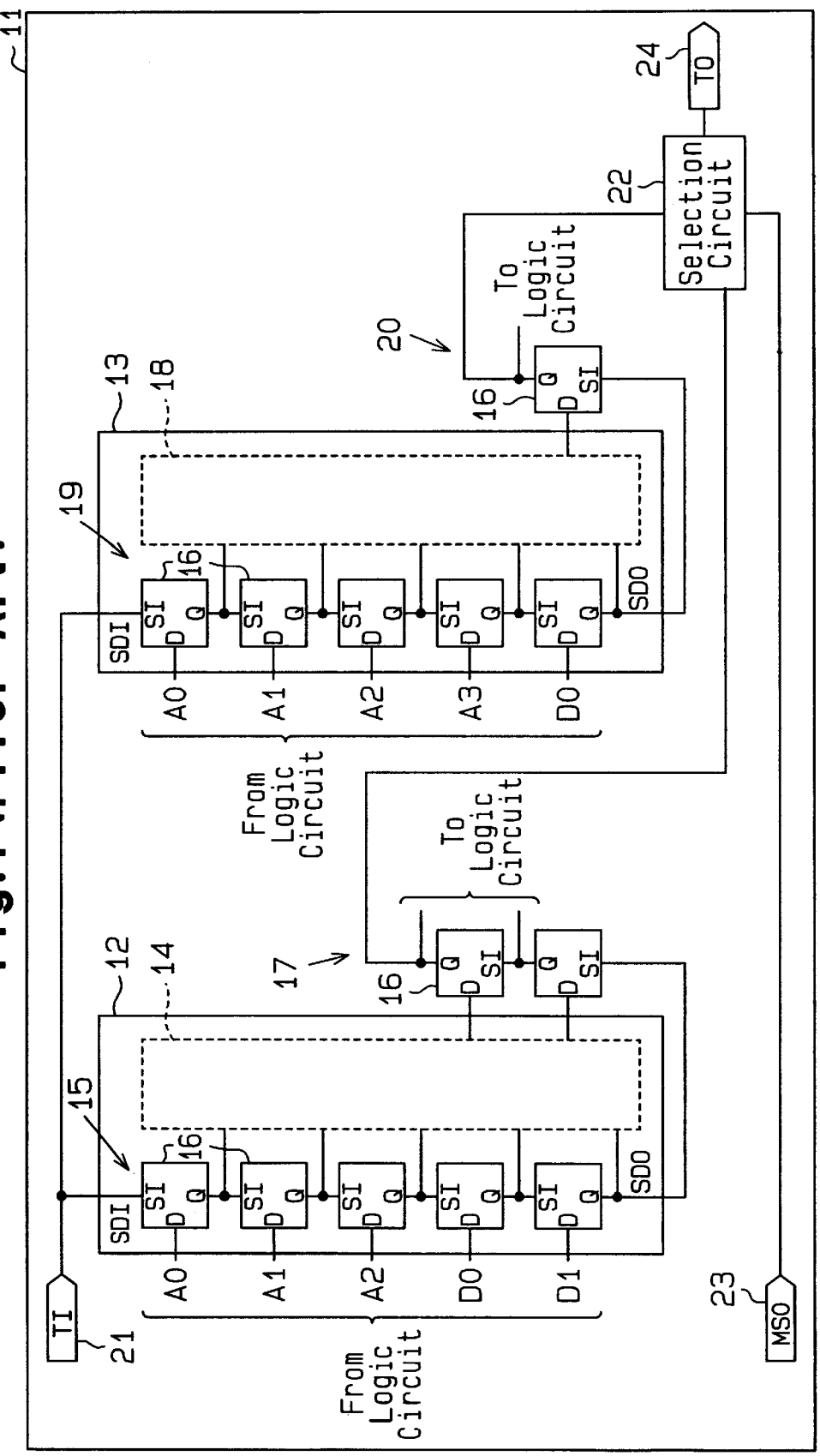
FIG. 1 is a schematic block diagram showing a prior art semiconductor device.

In the drawings, like numerals are used for like elements throughout.

Figure 2:
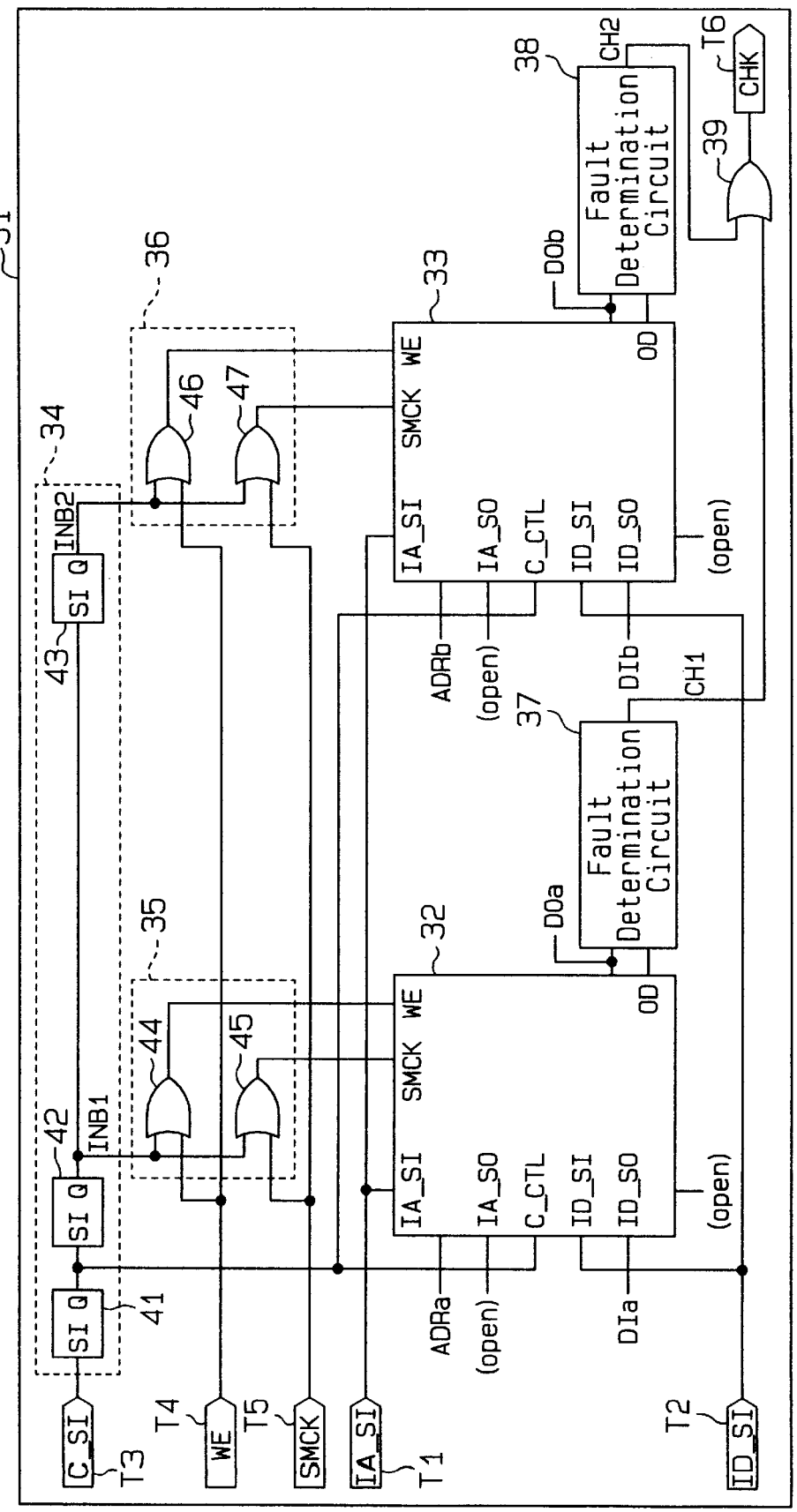
FIG. 2 is a schematic block diagram showing a semiconductor device according to a first embodiment of the present invention.

FIG. 2 is a schematic block diagram showing a semiconductor device 31 according to a first embodiment of the present invention. The semiconductor device 31 includes a plurality of (in this embodiment, two) memory circuits 32, 33, an operation control scan chain 34 used to test the memory circuits 32, 33, signal control circuits 35, 36, fault determination circuits 37, 38, and an OR circuit 39 functioning as a signal synthesizing circuit. The circuits 32–39 are arranged on the same semiconductor integrated circuit chip. Logic circuits (not shown) connected to the memory circuits 32, 33 and an external terminal (not shown) connecting the semiconductor device 31 to an external device are also provided on the semiconductor integrated circuit chip. The logic circuits and external terminal will not be discussed in detail since they are not directly related with the testing of the memory circuits 32, 33.

In a normal operation mode, the memory circuits 32, 33 store input data DIa, DIb in memory areas corresponding to addresses ADRa, ADRb provided from logic circuits in accordance with clock signals (not shown), respectively. The memory circuits 32, 33 then respectively provide output data DOa, DOb, which are read from their memory areas, to the respective logic circuits.

The semiconductor device 31 has a plurality of external terminals T1–T6, which are used to test the first and second memory circuits 32, 33. The external terminals T1, T2 provide addresses and write data to the first and second memory circuits 32, 33. The external terminals T3, T4, T5 provide control signals to the memory circuits 32, 33. The external terminal T6 outputs the testing result of the memory circuits 32, 33.

The first and second memory circuits 32, 33 are connected in parallel between the external terminals T1, T2. A serial scan-in address IA_SI is provided to the memory circuits 32, 33 via the external terminal T1. A serial scan-in data ID_SI is provided to the memory circuits 32, 33 via the external terminal T2. The scan-in address IA_SI and the scan-in data ID_SI are provided simultaneously to the first and second memory circuits 32, 33.

A serial operation control signal C_SI is provided to the operation control scan chain 34 (hereafter referred to as control chain) from the tester via the third external terminal T3. The control chain 34 has three (the number being n+1 for an n number of memory circuits) series-connected SFFs 41, 42, 43, which are set in accordance with the first and second memory circuits 32, 33. A scan data input terminal SI of the first SFF 41 is connected to the external terminal T3. Output terminals Q of the first and second SFFs 41, 42 are connected to the scan data input terminals SI of the second and third SFFs 42, 43, respectively. Each of the SFFs 41–43 latches the signal received at its input terminal SI in accordance with a scan clock SMCK and outputs the latched signal.

A pattern control signal C_CTL latched by the first SFF 41 is provided to the first and second memory circuits 32, 33. A first enable control signal INB1 latched by the second SFF 42 is provided to a first signal control circuit 35. A second enable control signal INB2 latched by the third SFF 43 is provided to the second signal control circuit 36. The control chain 34 receives the serial control signals C_SI and outputs a parallel control signal C_CTL, INB1, INB2. The control signals C_SI are provided in the order of the bit of the second enable control signal INB2, the bit of the first enable control signal INB1, and the bit of the pattern control signal C_CTL.

The first and second signal control circuits 35, 36 receive from the tester a write enable signal WE via the fourth external terminal T4 and the scan clock SMCK via the fifth terminal T5.

The first signal control circuit 35 includes OR circuits 44, 45. The OR circuit 44 performs a logical sum calculation of the first enable control signal INB1 and the write enable signal WE and provides the first memory circuit 32 with a signal representing the calculation result. The OR circuit 45 performs a logical sum calculation of the first enable control signal INB1 and the scan clock SMCK and provides the first memory circuit 32 with a signal representing the calculation result.

The first signal control circuit 35 selectively provides the write enable signal WE and the scan clock SMCK to the first memory circuit 32 in response to the first enable control signal INB1. That is, the write enable signal WE and the scan clock signal SMCK provided to the first memory circuit 32 by the first signal control circuit 35 go high when the first enable control signal INB1 goes high and become the same level as the input level when the first enable control signal INB1 goes low.

The second signal control circuit 36 includes OR circuits 46, 47 and selectively provides the write enable signal WE and the scan clock SMCK to the second memory circuit 33 in response to the second enable control signal INB2.

The first memory circuit 32 performs a write operation when the write enable signal WE goes low and performs a read operation when the write enable signal WE goes high. During the write operation mode, the first memory circuit 32 stores the scan-in data ID_SI in the memory area corresponding to the scan-in address IA_SI. The first memory circuit 32 then provides the first fault determination circuit 37 with anticipated value data OD corresponding to the scan-in data.

During the read operation mode, the first memory circuit 32 provides the first fault determination circuit 37 with output data DOa read from the memory area corresponding to the scan-in address IA_SI.

The first fault determination circuit 37 compares the anticipated value data OD and the output data DOa and provides a first determination signal CH1, which represents the comparison result, to the OR circuit 39. More specifically, the first determination signal CH1 provided to the OR circuit 39 goes low when the anticipated value data OD and the output data DOa match and goes high when the anticipated value data OD and the output data DOa do not match.

The second memory circuit 33 performs a write operation when the write enable signal WE goes low and performs a read operation when the write enable signal WE goes high. During the write operation mode, the second memory circuit 33 stores the scan-in data ID_SI in the memory area corresponding to the scan-in address IA_SI. The second memory circuit 33 then provides the second fault determination circuit 38 with anticipated value data OD corresponding to the scan-in data.

During the read operation mode, the second memory circuit 33 provides the second fault determination circuit 38 with output data DOb read from the memory area corresponding to the scan-in address IA_SI.

The second fault determination circuit 38 compares the anticipated value data OD and the output data DOb and provides a second determination signal CH2, which represents the comparison result, to the OR circuit 39. More specifically, the second determination signal CH2 provided to the OR circuit 39 goes low when the anticipated value data OD and the output data DOb match and goes high when the anticipated value data OD and the output data DOb do not match.

The OR circuit 39 executes a logical sum calculation based on the first and second determination signals CH1, CH2 and provides a synthesized determination signal CHK as the calculation result to the tester via the sixth external terminal T6. The tester determines whether there is a fault in the first and second memory circuits 32, 33 based on the synthesized determination signal CHK. When the first and second determination signals CH1, CH2 are low, the read data DOa, DOb match the anticipated value data OD. When the first and second determination signals CH1, CH2 are high, the read data DOa, DOb do not match the anticipated value data OD. Accordingly, when the synthesized determination signal CHK is high, at least one of the first and second memory circuits 32, 33 has a fault.

Figure 3:
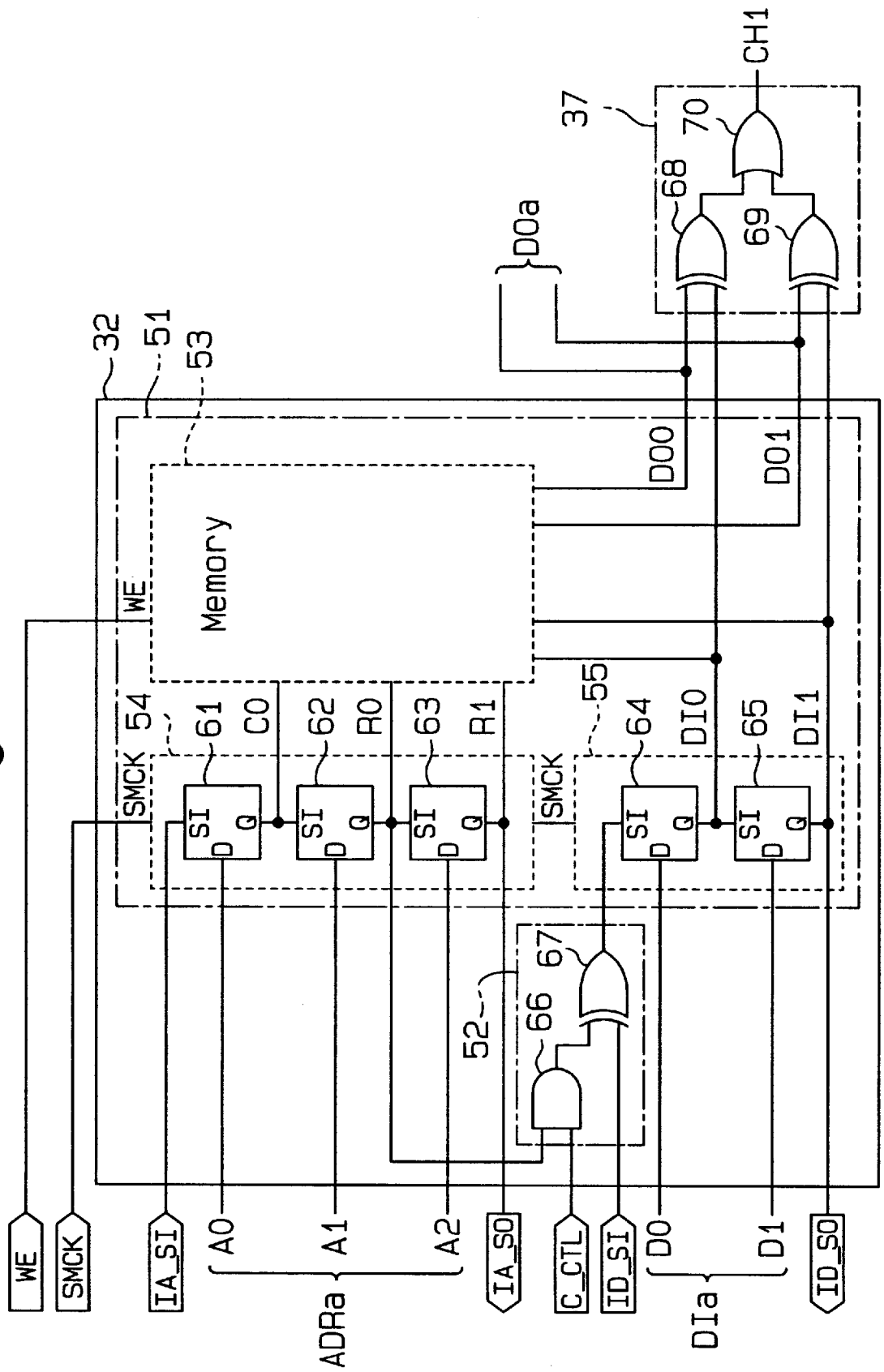
FIG. 3 is a schematic block diagram showing a first memory circuit and a fault determination circuit of the device of FIG. 2.

FIG. 3 is a schematic block diagram showing the first memory circuit 32 and the first fault determination circuit 37.

The first memory circuit 32 has a memory section 51 and a signal inverting circuit 52. The memory section 51 includes a memory 53, a first address scan chain 54, and a second data-in scan chain 55.

The first scan chain 54 has three series-connected SFFs 61, 62, 63, the number of which corresponds to the number of bits of the address signal ADRa. Bits A0, A1, A2 of the address signal ADRa are provided to data input terminals D of the SFFs 61, 62, 63, respectively. The scan input terminal SI of the first SFF 61 is provided with the scan-in address IA_SI, and a scan-out address IA_SO is output via the second SFF 62 from an output terminal Q of the third SFF 63.

Since the SFFs 61–63 operate in accordance with the scan clock SMCK, the first scan chain 54 functions as a shift register. The first scan chain 54 receives the serial scan-in address IA_SI and provides a column address signal C0 and row address signals R0, R1 to the memory 53.

The second scan chain 55 has two series-connected SFFs 64, 65, the number of which corresponds to the number of bits of the input data DIa. Bits D0, D1 of the input data DIa are provided to input terminals D of the SFFs 64, 65, respectively. A scan input terminal SI of the first SFF 64 is provided with the scan-in data ID_SI, and a scan-out data ID_SO is output from an output terminal Q of the second SFF 65.

Since the SFFs 64, 65 operate in accordance with the scan clock SMCK, the second scan chain 55 functions as a shift register. The second scan chain 55 receives the serial scan-in data ID_SI and provides input data DI0, DI1 to the memory 53. Further, the second scan chain 55 provides the input data DI0, DI1 as the anticipated value data to the first fault determination circuit 37.

The memory 53 performs a write or read operation in response to the write enable signal WE. During the write operation mode, the memory 53 stores the input data DI0, DI1 in the memory areas determined by the column address C0 and the row addresses R0, R1. During the read operation mode, the memory 53 provides the first fault determination circuit 37 with output data DO0, DO1 read from the memory areas determined by the column address C0 and the row addresses R0, R1. In this manner, the memory circuit 32 provides two bits of the anticipated value data and two bits of the output data DO0, DO1 to the first fault determination circuit 37.

The signal inverting circuit 52 is arranged along the route through which the scan-in data ID_SI is transferred and includes an AND circuit 66 and an XOR circuit 67. The AND circuit 66 is provided with the row address R0, which is the lowest order bit of the address signal ADRa, and the pattern control signal C_CTL. The XOR circuit 67 is provided with the output signal of the AND circuit 66 and the scan-in data ID_SI. The output terminal of the XOR circuit 67 is connected to the scan data input terminal SI of the first SFF 64 in the scan chain 55.

The signal inverting circuit 52 changes the test pattern written to the memory 53 in accordance with the pattern control signal C_CTL. The test pattern is used to write 0 and 1 to a memory cell to facilitate detection of interference, or the like, between cells. In this embodiment, the test pattern includes a checker pattern and a march pattern. With reference to FIG. 5(a), the checker pattern is used to arrange 0 and 1 in a checkerboard-like (grid-like) manner in a memory cell. In comparison, the march pattern is used to arrange 0 and 1 alternately in the rows and columns of a memory cell.

When the row address R0 is "1" (in FIG. 5(a), "1" of the "01" in the second row and "1" of "11" in the fourth row), the checker pattern is converted to the march pattern (or, contrarily, the march pattern is converted to the checker pattern). In other words, the inverting operation of the signal inverting circuit 52 enables a march pattern test and a checker pattern test to be performed. This decreases the number of test patterns that must be prepared beforehand.

The first fault determination circuit 37 includes two XOR circuits 68, 69, the number of which corresponds to the number of output bits (two bits) of the first memory circuit 32, and an OR circuit 70. The first XOR circuit 68, which corresponds with the first bit, receives the output data DO0 from the memory 53 and the input data DI0 from the first SFF 64. Then, the first XOR circuit 68 provides the OR circuit 70 with a low signal when the two data match and a high signal when the two data do not match. The second XOR circuit 69, which corresponds with the second bit, receives the output data DO1 from the memory 53 and the input data DI1 from the second SFF 65. In the same manner as the first XOR circuit 68, the second XOR circuit 69 provides the OR circuit 70 with a signal representing the comparison result. The OR circuit 70 performs a logical sum calculation based on the input signals and outputs a first determination signal CH1. The first determination signal CH1 output by the first fault determination circuit 37 goes low when the write data from the first memory circuit 32, or the anticipated value data DI0, DI1, matches the read data DO0, DO0 and goes high when the anticipated value data DI0, DI1, do not match the read data DO0, DO1.

Figure 4:
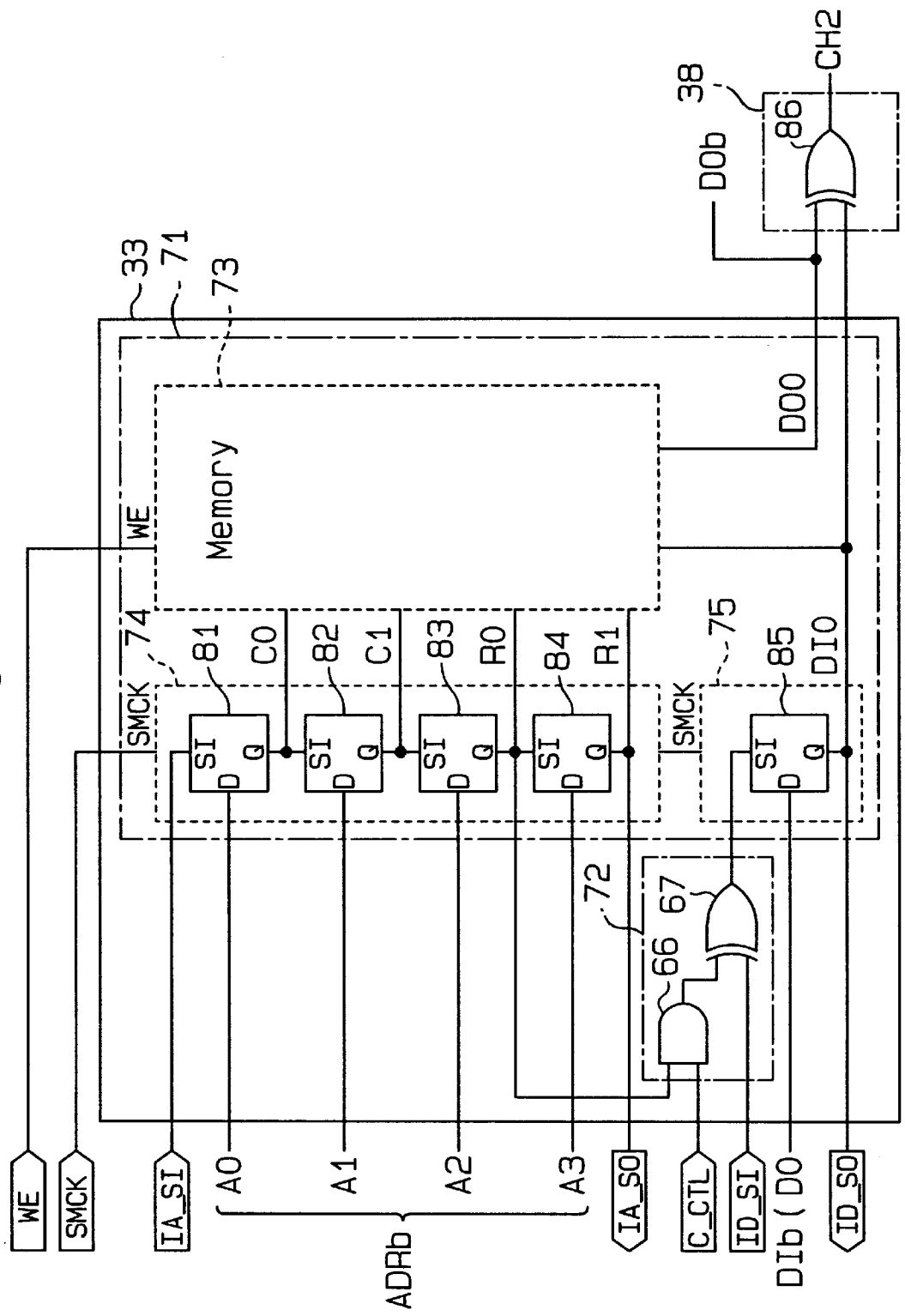
FIG. 4 is a schematic block diagram showing a second memory circuit and a fault determination circuit of the device of FIG. 2.

FIG. 4 is a schematic block diagram showing the second memory circuit 33 and the second fault determination circuit 38.

The second memory circuit 33 has a memory section 71 and a signal inverting circuit 72. The memory section 71 includes a memory 73, a first address scan chain 74, and a second data-in scan chain 75.

The first scan chain 74 has four series-connected SFFs 81, 82, 83, 84, the number of which corresponds to the number of bits of the address signal ADRb. Bits A0, A1, A2, A3 of the address signal ADRb are provided to data input terminals D of the SFFs 81, 82, 83, 84, respectively. The scan input terminal SI of the first SFF 81 is provided with the scan-in address IA_SI, and the scan-out address IA_SO is output via the second and third SFFs 82, 83 from an output terminal Q of the fourth SFF 84.

Since the SFFs 81–84 operate in accordance with the scan clock SMCK, the first scan chain 74 functions as a shift register. The first scan chain 74 receives the serial scan-in address IA_SI and provides the column address signals C0, C1 and the row address signals R0, R1 to the memory 73.

The second scan chain 75 has an SFF 85, the number of which corresponds to the number of bits of the input data DIb. Bit D0 of the input data DIb is provided to an input terminal D of the SFF 85. An scan input terminal SI of the SFF 85 is provided with the scan-in data ID_SI, and the scan-out data ID_SO is output from an output terminal Q of the SFF 85.

Since the SFF 85 operates in accordance with the scan clock SMCK, the second scan chain 75 functions as a shift register. The second scan chain 75 receives the serial scan-in data ID_SI and provides the input data DI0 to the memory 73. Further, the second scan chain 75 provides the input data DI0 as anticipated value data to the second fault determination circuit 38.

The memory 73 provides the second fault determination circuit 38 with cell information read from the memory areas determined by the column addresses C0, C1 and the row addresses R0, R1 as output data DO0. Accordingly, the second memory circuit 33 provides one bit of the anticipated value data and one bit of the output data DO0 to the second fault determination circuit 38.

The signal inverting circuit 72 is arranged along the route through which the scan-in data ID_SI is transferred and changes the test pattern written to the memory 73 in accordance with the pattern control signal C_CTL. In other words, the signal inverting circuit 72 enables the test data of the checker pattern and the test data of the march pattern to be written using one pattern data. FIG. 5(b) shows the checker pattern written to the memory 73 of the second memory circuit 33.

The second fault determination circuit 38 includes an XOR circuit 86, the number of which corresponds to the number of output bits (one bit) of the second memory circuit 33. The XOR circuit 86 receives one bit of the output data DO0 from the memory 73 and the input data DI0 from the SFF 85. Then, the XOR circuit 86 outputs a low second determination signal CH2 when the input and output data match and a high second determination signal CH2 when the input and output data do not match.

The memory circuits 32, 33 may be configured using the same memory macro data. A design apparatus (not shown) can receive specification data of the semiconductor device 31 (e.g., the capacity of the memory circuits 32, 33 and address configuration), determine the configuration of the memories 53, 73, the first scan chains 54, 74, and the second scan chains 55, 75, and arrange these circuits in accordance with the connections to logic circuits to generate the layout data of the semiconductor device 31.

Testing of the semiconductor device 31 will now be described.

Preparation

Testing pattern data is generated prior to the testing of the semiconductor device 31 (the first and second memory circuits 32, 33). At this time, pattern data corresponding to the maximum address bit number and pattern data corresponding to the maximum data bit number are generated.

The first memory circuit 32 has an address width of three bits and a data width of two bits. The second memory circuit 33 has an address width of four bits and a data width of one bit. Accordingly, test pattern data for the scan-in address IA_SI having an address width of four bits and test pattern data for the scan-in data ID_SI having an address width of two bits are generated. In other words, one type of test pattern data is generated for the plural memory circuits 32, 33. FIG. 6 is a chart showing test pattern data represented by the labels of "Address" and "Data Input."

Testing

The following steps are taken to test the semiconductor device 31.

(1) The tester provides a low write enable signal WE to the first and second signal control circuits 35, 36 via the external terminal T4.

(2) The tester provides the operation control signals C_SI "0, 0, 1" via the external terminal T3.

In accordance with the operation control signals C_SI, the control chain 34 causes the first and second enable control signals INB1, INB2 to go low and the pattern control signal C_CTL to go high. The first and second signal control circuits 35, 36 provide the low write enable signal WE to the first and second memory circuits 32, 33. In this manner, the first and second memory circuits 32, 33 enter the write operation mode.

(3) The tester provides the first and second memory circuits 32, 33 with the scan-in address IA_SI from the external terminal T1 and the scan-in data ID_SI from the external terminal T2.

For example, as shown in the second row of the chart of FIG. 6, the first and second memory circuits 32, 33 may be provided with the pattern scan-in address IA_SI of "0, 0, 0, 1" and the scan-in data ID_SI of "0, 0".

In the first scan chain 54 of the first memory circuit 32, the three SFFs 61–63 shift the scan-in address IA_SI in accordance with the scan clock SMCK and latches the bit data "0, 0, 1" of the second to fourth bits. That is, the first scan chain 54 latches three bits as valid data and provides the row addresses R1, R0 "0, 0" and the column address C0 "1" to the memory 53.

In the first scan chain 74 of the second memory circuit 33, the four SFFs 81–84 shift the scan-in address IA_SI in accordance with the scan clock SMCK and latches the bit data of the four bits. That is, the first scan chain 74 latches all of the four bits as valid data and provides the memory 73 with the row addresses R1, R0 "0, 0" and the column addresses C1, C0 "0, 1".

In accordance with the low row address R0 and the high pattern control signal C_CTL, the signal inverting circuits 52, 72 provide the scan-in data ID_SI to the corresponding second scan chains 55, 75.

In the second scan chain 55 of the first memory circuit 32, the two SFFs 64, 65 shift the scan-in data ID_SI in accordance with the scan clock SMCK and latch the bit data of the two bits. That is, the second scan chain 55 latches both of the bits as valid data and provides the memory 53 with the input data DI1, DI0 "0, 0".

In the second scan chain 75 of the second memory circuit 33, the SFF 85 shifts the scan-in data ID_SI in accordance with the scan clock SMCK and latches the bit data "0" of the second bit. That is, the second scan chain 75 latches the first bit as valid data and provides the memory 73 with the input data DI0 (0).

In this manner, the address and input data of the first and second memory circuits 32, 33 are set simultaneously by the scan-in address IA_SI and the scan-in data ID_SI, which are based on the same test pattern data.

The tester then provides the scan-in address IA_SI "0010" and the scan-in data ID_SI "11" to the first and second memory circuits 32, 33 (the pattern shown in the third row of the chart of FIG. 6).

The first scan chain 54 of the first memory circuit 32 latches the three second to fourth bits "010" as valid data and provides the memory 53 with the row addresses R1, R0 "01" and the column address C0 "0". The first scan chain 74 of the second memory circuit 33 latches all four of the bits and provides the memory 73 with the row addresses R1, R0 "00" and the column address C1, C0 "10".

The signal inverting circuit 52 inverts the scan-in data ID_SI in accordance with the high row address R0 and the high pattern control signal C_CTL and provides the inverted scan-in data ID_SI "00" to the second scan chain 55. The second scan chain 55 provides the input data DI1, DI0 "00" to the memory 53.

The signal inverting circuit 72 provides the scan-in data ID_SI to the second scan chain 75 in accordance with the low row address R0 and the high pattern control signal C_CTL. The second scan chain 75 latches the second bit and provides the input data DI0 "1" to the memory 73.

Then, the scan-in address IA_SI "0100" and the scan-in data ID_SI "11" are provided to the first and second memory circuits 32, 33 (the pattern shown in the fifth row of the chart of FIG. 6).

The first scan chain 54 latches the three bits "100" and provides the row addresses R1, R0 "10" and the column address C0 "0" to the memory 53. The first scan chain 74 latches all four of the bits and provides the row addresses R1, R0 "01" and the column addresses C1, C0 "00" to the memory 73.

The signal inverting circuit 52 provides the scan-in data ID_SI "11" to the second scan chain 55 in accordance with the low row address R0 and the high pattern control signal C_CTL. The second scan chain 55 latches both of the bits and provides the input data DI1, DI0 "11" to the memory 53.

The signal inverting circuit 72 inverts the scan-in data ID_SI in accordance with the high row address R0 and the high pattern control signal C_CTL and provides the inverted scan-in data ID_SI "00" to the second scan chain 75. The second scan chain 75 provides the input data DI0 "0" to the memory 73.

In this manner, the signal inverting circuit 52 inverts data when the row address R0 (the third bit in the address of the chart of FIG. 6) is "1". This writes checker pattern data, such as that shown in FIG. 5(*a*), to the memory 53 (RAM_X in FIG. 6) of the first memory circuit 32. The signal inverting circuit 72 inverts data when the row address R0 (the second bit in the address of the chart Fig. 6) is "1". This writes checker pattern data, such as that shown in FIG. 5(*b*), to the memory 73 (RAM_Y in FIG. 6) of the second memory circuit 32.

The semiconductor device 31 of the first embodiment has the advantages described below.

(1) The first and second memory circuits 32, 33 include the first address scan chains 54, 74 and the second data-in scan chains 55, 75, respectively. This enables the tester to simultaneously provide the first and second memory circuits 32, 33 with one test pattern data to test the memory circuits 32, 33. Thus, the time for preparing and loading the test pattern data is decreased and, consequently, the actual testing time is shortened.

(2) The signal inverting circuits 52, 72 inverts the scan-in data ID_SI in accordance with the lowest order bit R0 and the pattern control signal C_CTL. This facilitates shifting from the march pattern to the checker pattern and from the checker pattern to the march pattern. Further, since only one of the march pattern and the checker pattern is required to be prepared, the time for preparing the pattern is decreased.

(3) The control chain 34 generates the write enable signal WE and the first and second enable control signals INB1, INB2 from the operation control signals C_SI. Thus, an external terminal for controlling the transmission and inhibition of the plural control signals WE, SMCK is not necessary and an increase in the chip size of the semiconductor device 31 is avoided.

(4) The first and second fault determination circuits 37, 38 compare the data output signals and the data input signals of the first and second memory circuits 32, 33 to generate the first and second determination signals CH1, CH2. The OR circuit 39 synthesizes the first and second determination signals CH1, CH2 to generate the determination signal CHK. As a result, the determination result is provided to the tester through the single external terminal T6. This decreases the number of external terminals in comparison to when using an external terminal for each determination signal or data output signal. Thus, an increase in the chip size of the semiconductor device 31 is avoided.

It should be apparent to those skilled in the art that the present invention may be embodied in many other specific forms without departing from the spirit or scope of the invention. Particularly, it should be understood that the present invention may be embodied in the following forms.

Figure 7:
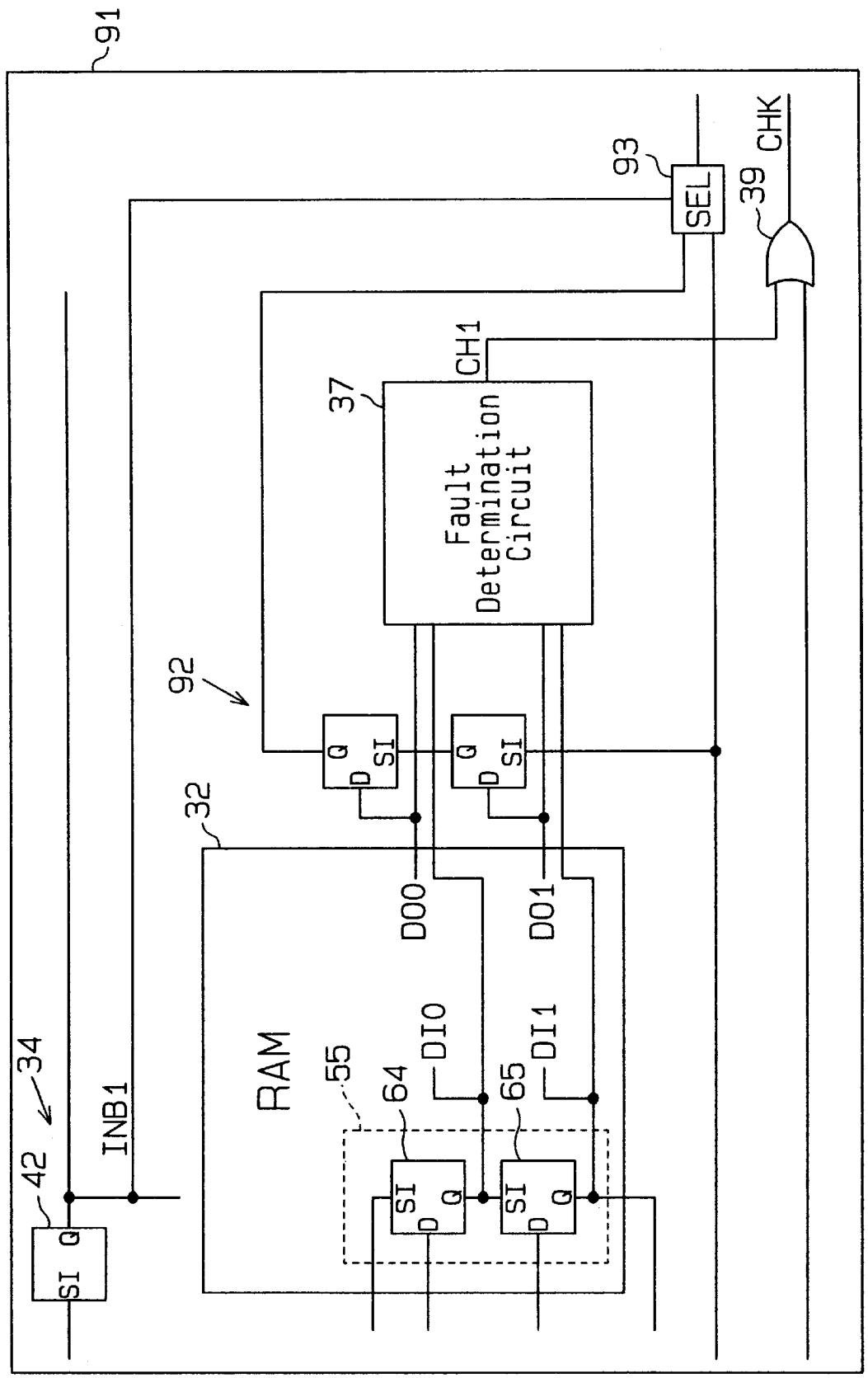
FIG. 7 is a schematic block diagram showing a semiconductor device according to a second embodiment of the present invention.

With reference to FIG. 7, the present invention may be applied to a semiconductor device 91 in which a scan chain 92 is connected to the output terminal of the first memory circuit 32 and a selection circuit 93 is connected to the scan chain 92. Although not shown in FIG. 7, a second scan chain is connected to the output terminal of the second memory circuit 33 and a second selection circuit is connected to the second scan chain. In this case, the selection circuit 93 receives as a selection signal an enable control signal INB1 latched by the SFF 42 of the control chain 34. The output of the second selection circuit 93 is connected to the selection circuit, which receives the output signal of the second scan chain connected to the output terminal of the second memory circuit 33.

Figure 8:
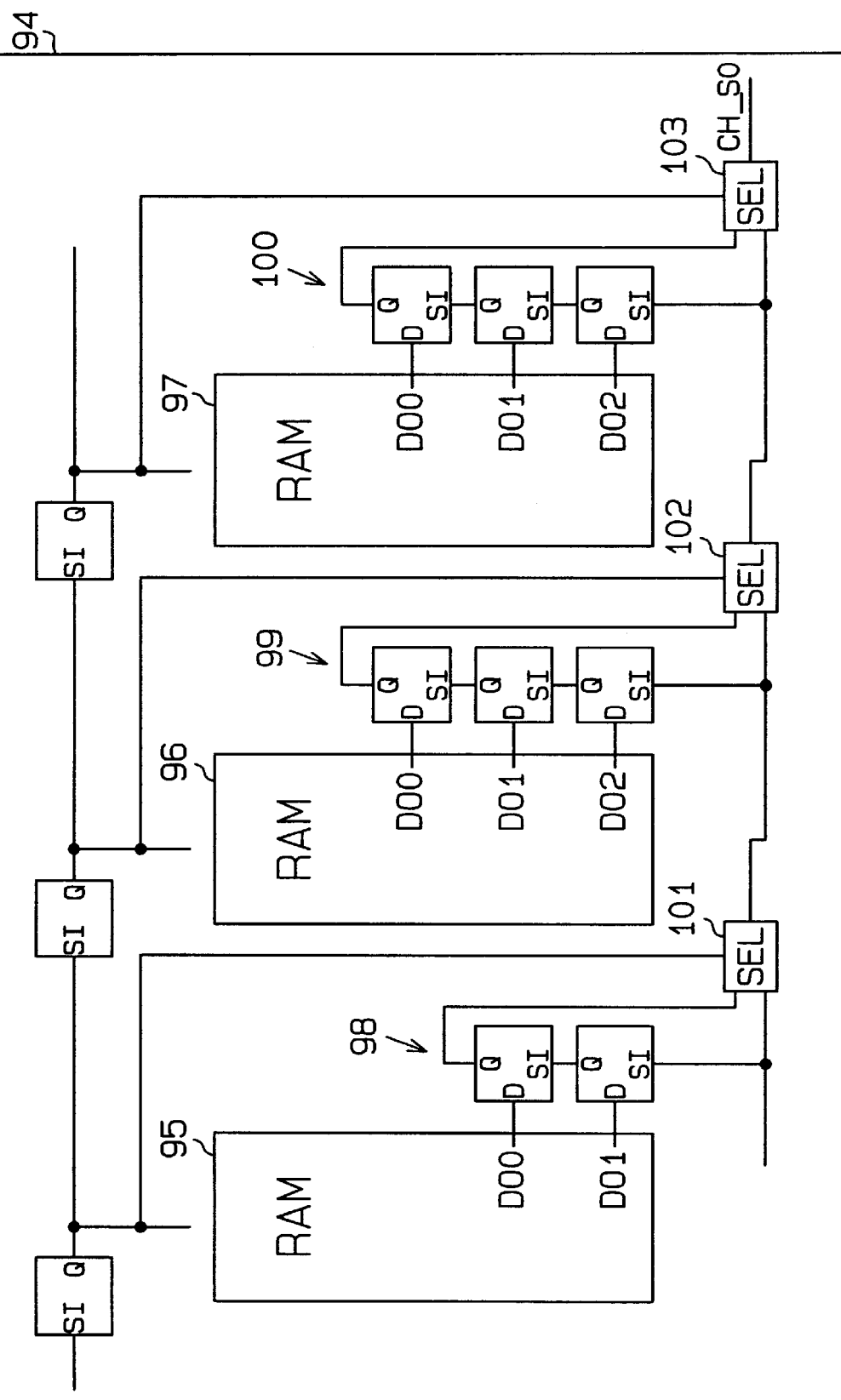
FIG. 8 is a schematic block diagram showing a semiconductor device according to a third embodiment of the present invention.

With reference to FIG. 8, the present invention may be applied to a semiconductor device 94 having a scan net. The scan net is configured by scan chains 98, 99, 100 connected to the output terminals of memory circuits 95, 96, 97, respectively, and selection circuits 101, 102, 103 connected to the outputs of the scan chains 98, 99, 100, respectively. The selection circuits 101, 102, 103 are connected in series. In FIG. 8, the fault determination circuits corresponding to each of the memory circuits 95, 96, 97 are not shown. In the scan net, the scan chains 98, 99, 100 are shifted in accordance with the scan clock SMCK. This provides the output signals of each memory circuit 95, 96, 97 as serial scan-out data CH_SO to a tester (not shown).

The tester determines whether the semiconductor devices 91, 94 are deficient based on synthesized signals CHK sent from the semiconductor devices 91, 94. The tester determines whether the memory circuits are deficient by analyzing each output bit in accordance with the scan-out data CH_SO.

Figure 9:
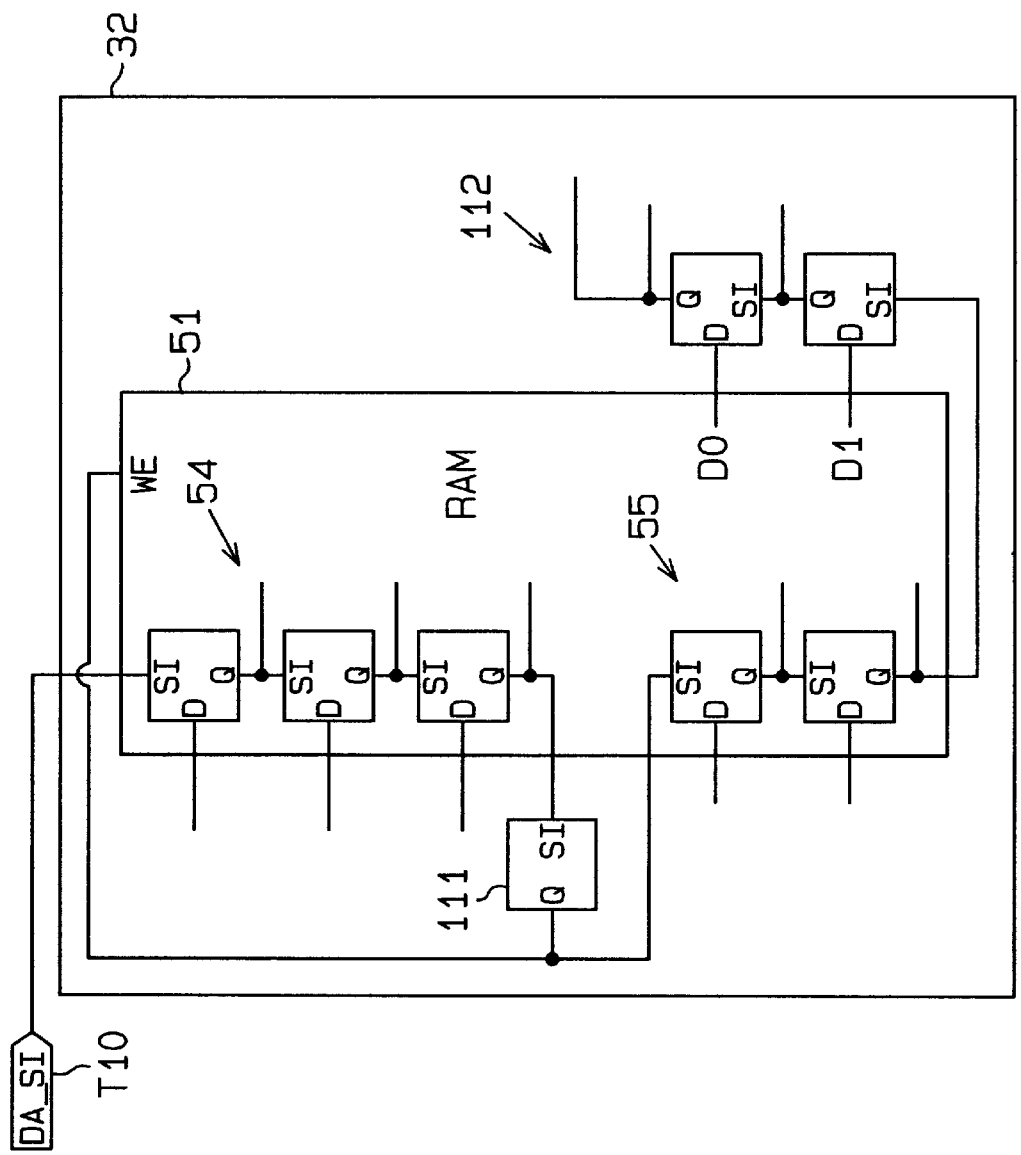
FIG. 9 is a schematic block diagram showing a semiconductor device according to a fourth embodiment of the present invention.

Scan type flip flops, the number of which corresponds to the difference between address widths, may be connected in series to an address scan chain for memory circuits having narrow widths. For example, as shown in FIG. 9, an SFF 111 may be connected in series to a first address scan chain 54, and a data output scan chain 112 may be connected in series to a data input scan chain 55. In this case, the output terminal Q of the SFF 111 is connected to the input terminal of the data input scan chain 55, and a scan-in signal DA_SI, in which the scan-in data and the scan-in address are serial, is provided from an external terminal T10. The SFF 111 absorbs the difference between the address widths. Data generated by shifting the scan-in data is provided to the memory 53 of the first memory circuit 32.

The output signal of the SFF 111 is provided to the memory circuit 32 as the write enable signal WE. The output signal of the SFF 111 corresponds to the leftmost bit of the address of FIG. 6. That is, the output signal of the SFF 111 is set at a low level when an address validating data storage is provided. Accordingly, the memory circuit 32 performs a write operation in response to the output signal. The employment of the output signal of the SFF 111 eliminates the need for the write enable signal. Thus, an external terminal and line for the write enable are not necessary. This avoids an increase in the area of semiconductor device.

The testing method using test pattern data in which the scan-in data and scan-in address are serial is the same as that of the prior art. Accordingly, the semiconductor devices according to the present invention may be tested using the conventional tester. This saves equipment-related cost.

Figure 10:
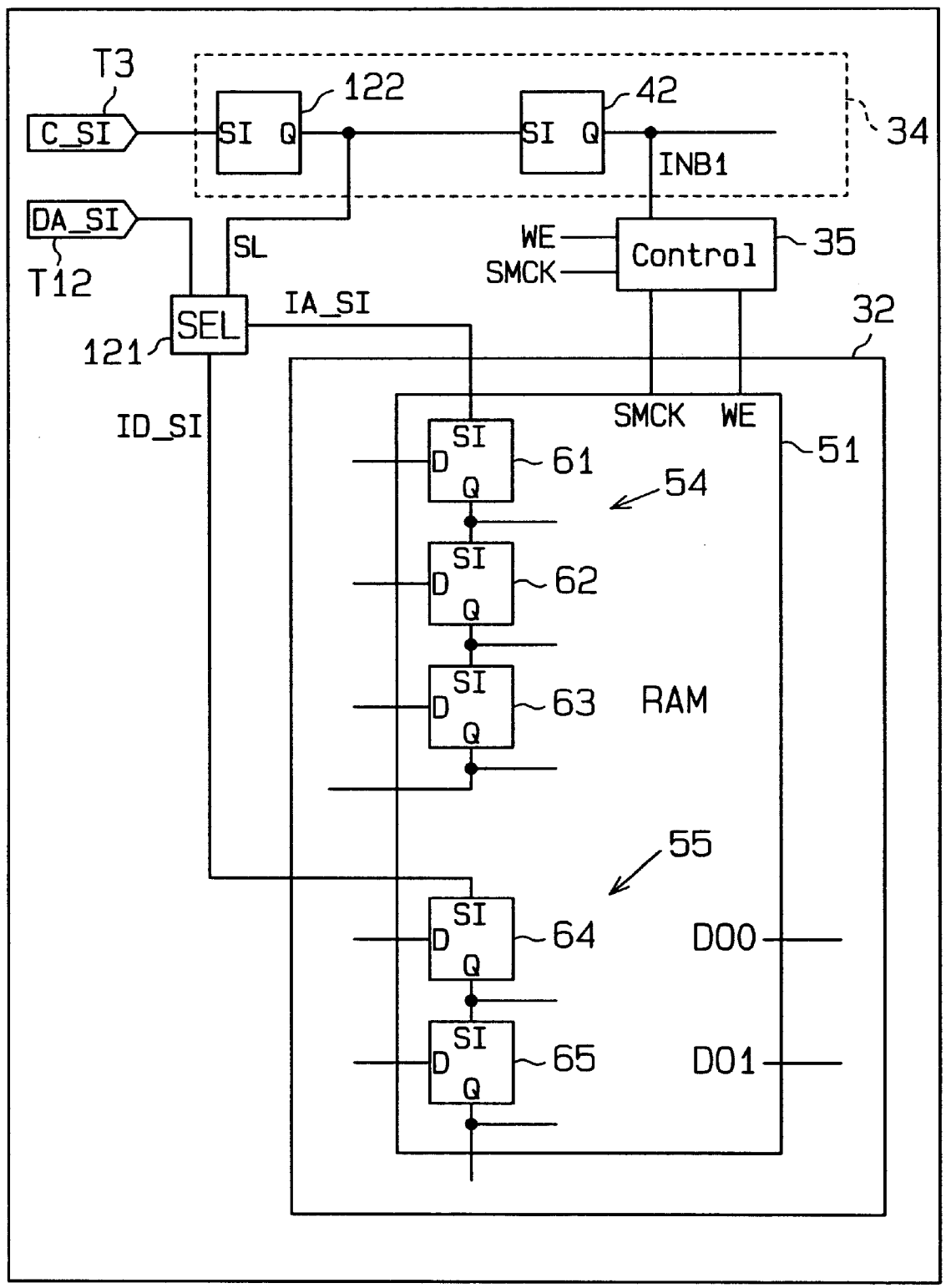
FIG. 10 is a schematic block diagram showing a semiconductor device according to a fifth embodiment of the present invention.

The scan-in address IA_SI and the scan-in data ID_SI may be provided through a single external terminal. That is, as shown in FIG. 10, the input terminal of a first address scan chain 54 and the input terminal of a data second scan chain 55 may be connected to a selection circuit 121. The selection circuit 121 is connected to an external terminal T12 and to the output terminal Q of an SFF 122 of the control chain 34. Although not shown in FIG. 10, the second memory circuit 33 has the same configuration.

The SFF 122 latches the operation control signals C_SI and provides a selection signal SL to the selection circuit 121. In accordance with the selection signal SL, the selection circuit 121 separates the scan-in signal DA_SI and generates the scan-in address IA_SI and the scan-in data ID_SI.

By using only one external terminal, the number of external terminals used for testing decreases and prevents an increase in the area of the semiconductor device.

Figure 11:
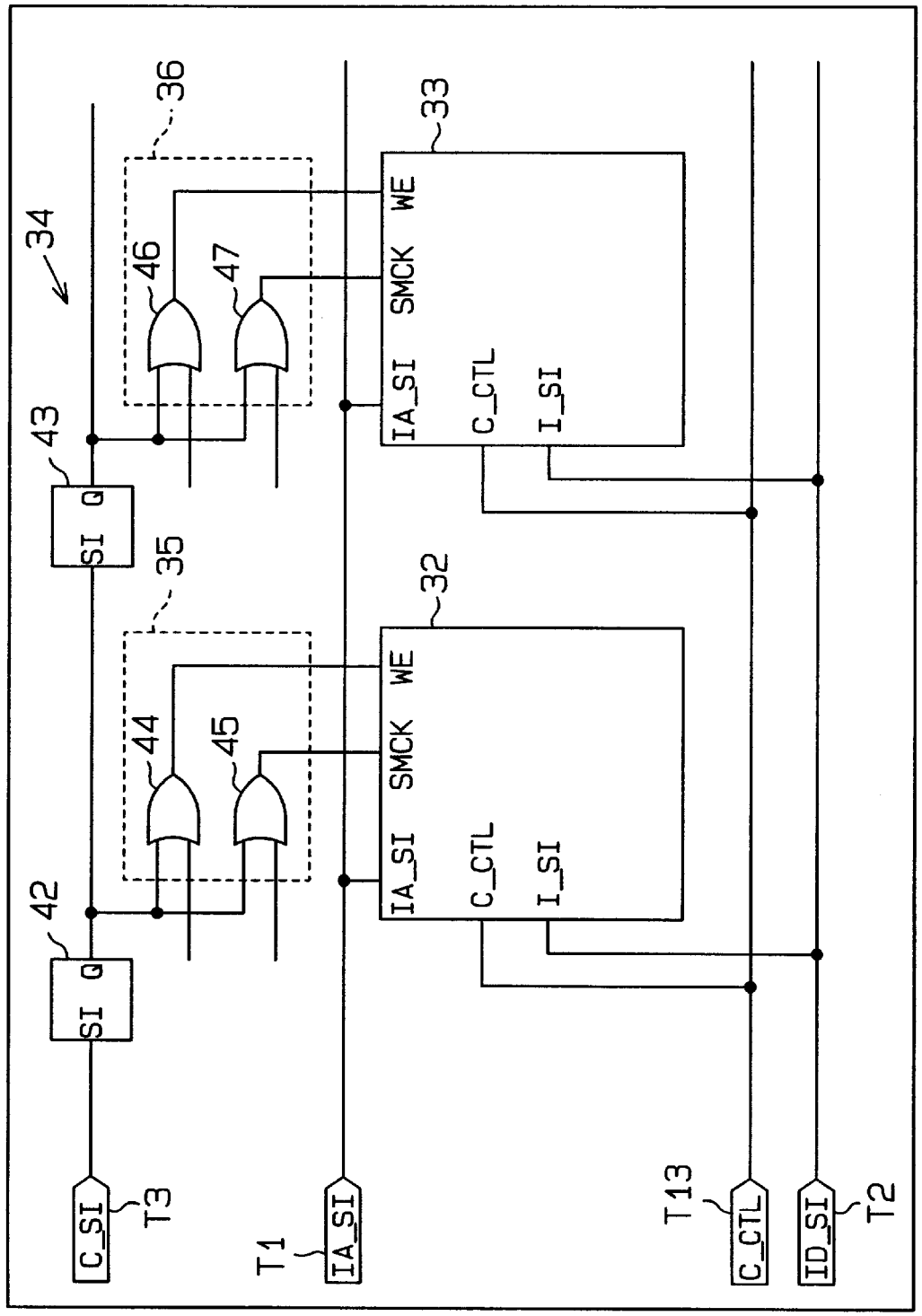
FIG. 11 is a schematic block diagram showing a semiconductor device according to a sixth embodiment of the present invention.

As shown in FIG. 11, a further external terminal T13 for providing the pattern control signal C_CTL may be employed. This facilitates shifting of the write pattern of the first and second memory circuits 32, 33.

Figure 12:
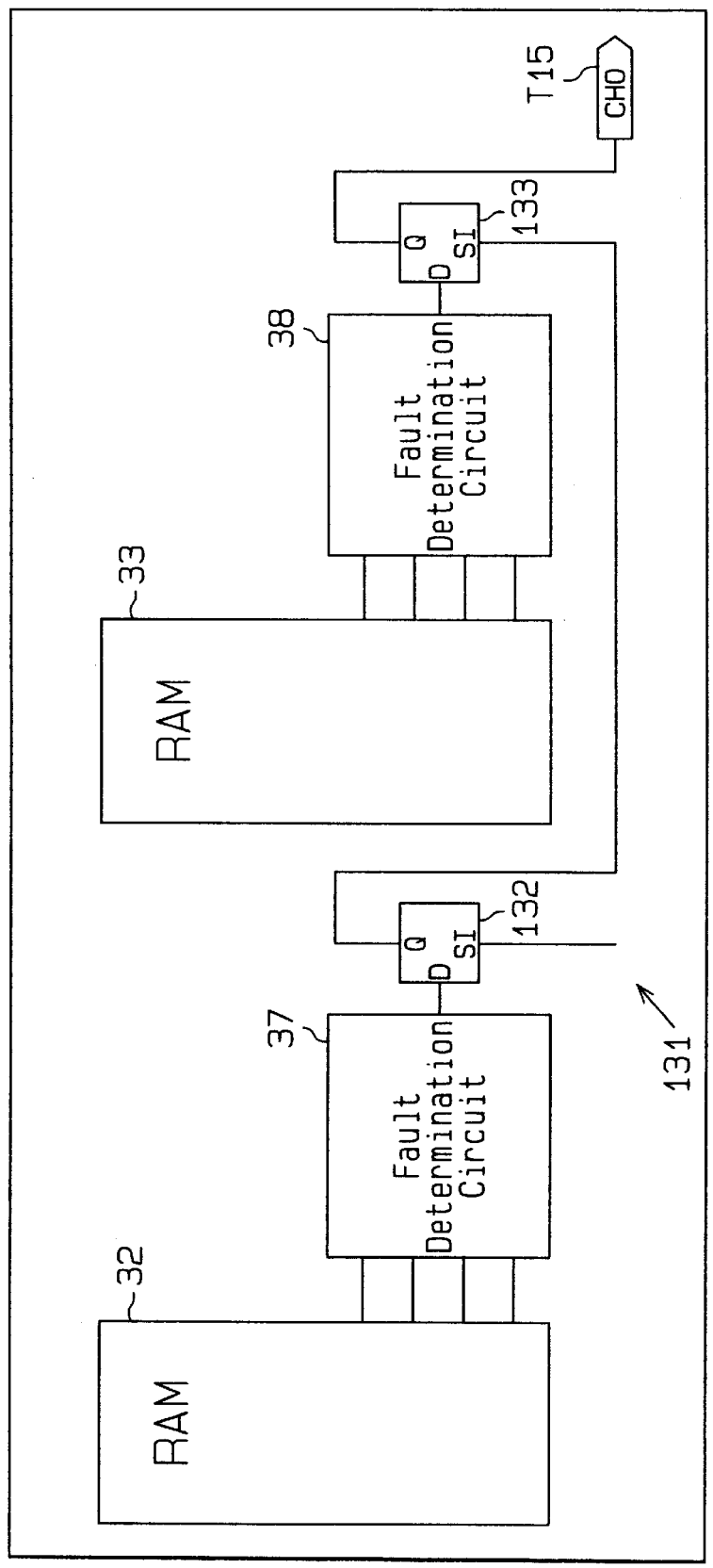
FIG. 12 is a schematic block diagram showing a semiconductor device according to a seventh embodiment of the present invention.

As shown in FIG. 12, a determination output scan chain 131 may be connected to the first and second fault determination circuits 37, 38. The scan chain 131 includes an SFF 132 connected to the first fault determination circuit and an SFF 133 connected to the second fault determination circuit 38. The SFF 132 and the SFF 133 are connected in series. The output terminal Q of the SFF 133 is connected to an external terminal T15.

The determination result of the memory circuits 32, 33 is output from a single external terminal T15 via the SFFs 132, 133. Accordingly, an increase in the area of the semiconductor device is avoided. Further, abnormalities of the memory circuits 32, 33 may be determined from the serial determination signal CHO output by the external terminal T15.

Instead of providing the operation control signals C_SI to the control chain 34 to simultaneously operate the first and second memory circuits 32, 33 with the first and second enable control signals INB1, INB2, the operation control signals C_SI may be provided to operate the first and second memory circuits 32, 33. In this case, the bit of the operation control signals C_SI corresponding to the memory circuit that is to be operated is set at "0".

The control chain 34 receives the operation control signals C_SI "1, 0, 1" and generates a low first enable control signal INB1 and a high second enable control signal INB2. In response to these signals, the first memory circuit 32 performs the write operation and the second memory circuit 33 is not operated. In this manner, by changing the bit configuration of the operation control signals C_SI, any memory circuit may be tested.

The present invention may be applied to a memory circuit having three or more memory circuits.

The present examples and embodiments are to be considered as illustrative and not restrictive, and the invention is not to be limited to the details given herein, but may be modified within the scope and equivalence of the appended claims.

What is claimed is:

1. A semiconductor device comprising:
    a plurality of memory circuits comprising a first memory circuit and a second memory circuit;
    wherein the first memory circuit comprises
        a first memory having a first address width and a first data width,
        a first address scan chain connected to the first memory to receive serial scan-in addresses and generate a first address signal corresponding to the first address width,
        a first signal inverting circuit to receive serial scan-in data, invert the scan-in data according to the first address signal and a pattern control signal, and generate first inverted scan-in data comprising a checker pattern used to arrange bits in a checkerboard format in memory cells of the first memory, and
        a first data scan chain connected to the first memory to receive the first inverted scan-in data from the first signal inverting circuit and generate a first data input signal corresponding to the first data width; and wherein the second memory circuit comprises
  a second memory having a second address width differing from the first address width and a second data width differing from the first data width,
  a second address scan chain connected to the second memory to receive the serial scan-in addresses and generate a second address signal corresponding to the second address width,
  a second signal inverting circuit to invert the scan-in data according to the second address signal and the pattern control signal and generate second inverted scan-in data comprising a checker pattern used to arrange bits in a checkerboard format in memory cells of the second memory, and
  a second data scan chain connected to the second memory to receive the second inverted scan-in data from the second signal inverting circuit and generate a second data input signal corresponding to the second data width.

2. The semiconductor device according to claim 1, further comprising:
  an operation control scan chain connected to the plurality of memory circuits to receive an operation control signal and generate the pattern control signal and a plurality of enable signals comprising a first enable control signal, which is associated with the first memory circuit, and a second enable control signal, which is associated with the second memory circuit; and
  a plurality of control circuits comprising a first control circuit for receiving the first enable control signal and a memory control signal and selectively providing the memory control signal to the first memory in accordance with the first enable control signal, and a second control circuit for receiving the second enable control signal and the memory control signal and selectively providing the memory control signal to the second memory in accordance with the second enable control signal.

3. The semiconductor device according to claim 1, further comprising:
  an operation control scan chain connected to the plurality of memory circuits to receive an operation control signal and generate a plurality of enable signals including a first enable control signal, which is associated with the first memory circuit, and a second enable control signal, which is associated with the second memory circuit; and
  a plurality of control circuits including a first control circuit for receiving the first enable control signal and a memory control signal and selectively providing the memory control signal to the first memory in accordance with the first enable control signal, and a second control circuit for receiving the second enable control signal and the memory control signal and selectively providing the memory control signal to the second memory in accordance with the second enable control signal.

4. The semiconductor device according to claim 1, further comprising:
  a plurality of fault determination circuits including a first fault determination circuit connected to the first memory and the first data scan chain to compare the first data input signal from the first data scan chain with a first data output signal from the first memory and generate a first comparison determination signal, and a second fault determination circuit connected to the second memory and the second data scan chain to compare the second data input signal from the second data scan chain with a second data output signal from the second memory and generate a second comparison determination signal; and
  a signal synthesizing circuit connected to the plurality of fault determination circuits to synthesize a plurality of comparison determination signals including the first and second comparison determination signals.

5. The semiconductor device according to claim 4, further comprising a plurality of data output scan chains including a first data output scan chain connected to the first memory to receive the first data output signal from the first memory and generate serial first scan-out data signals, and a second data output scan chain connected to the second memory to receive the second data output signal from the second memory and generate serial second scan-out data signals.

6. The semiconductor device according to claim 1, further comprising:
  a plurality of fault determination circuits including a first fault determination circuit connected to the first memory and the first data scan chain to compare the first data input signal from the first data scan chain with a first data output signal from the first memory and generate a first comparison determination signal, and a second fault determination circuit connected to the second memory and the second data scan chain to compare the second data input signal from the second data scan chain with a second data output signal from the second memory and generate a second comparison determination signal; and
  a determination output scan chain connected to the plurality of fault determination circuits to receive the plurality of comparison determination signals including the first and second comparison determination signals and generate serial scan-out determination signals.

7. The semiconductor device according to claim 1, wherein the first memory circuit includes a third scan chain connected between the first address scan chain and the first data scan chain, and wherein the second memory circuit includes a fourth scan chain connected between the second address scan chain and the second data scan chain.

8. The semiconductor device according to claim 1, further comprising a plurality of selection circuits including a first selection circuit connected to the first address scan chain and the first data scan chain to provide the scan-in addresses to the first address scan chain and the scan-in data to the first data scan chain in response to a first selection signal, and a second selection circuit connected to the second address scan chain and the second data scan chain to provide the scan-in addresses to the second address scan chain and the scan-in data to the second data scan chain in response to a second selection signal.

9. A method of testing a semiconductor device having a plurality of memory circuits comprising a first memory circuit and a second memory circuit, the method comprising:
  providing a first memory with a first address width and a first data width, a first address scan chain connected to the first memory, a first data scan chain connected to the first memory, and a first signal inverting circuit connected to the first data scan chain;
  receiving, by the first address scan chain, serial scan-in addresses and generating, by the first address scan chain, a first address signal corresponding to the first address width;

inverting, by the first signal inverting circuit, serial scan-in data according to the first address signal and a pattern control signal and generating first inverted scan-in data comprising a checker pattern used to arrange bits in a checkerboard format in memory cells of the first memory;

receiving, by the first data scan chain, the first inverted scan-in data from the first signal inverting circuit and generating, by the first data scan chain, a first data input signal corresponding to the first data width;

providing a second memory having a second address width differing from the first address width and a second data width differing from the first data width, a second address scan chain connected to the second memory, a second data scan chain connected to the second memory, and a second signal inverting circuit connected to the second data scan chain;

receiving, by the second address scan chain, the serial scan-in addresses and generating, by the second address scan chain, a second address signal corresponding to the second address width;

inverting, by the second signal inverting circuit, the scan-in data according to the second address signal and the pattern control signal and generating second inverted scan-in data comprising a checker pattern used to arrange bits in a checkerboard format in memory cells of the second memory; and receiving, by the second data scan chain, the second inverted scan-in data from the second signal inverting circuit and generating, by the second data scan chain, a second data input signal corresponding to the second data width.

\* \* \* \* \*